(12) United States Patent
Kiyono

(10) Patent No.: US 10,911,010 B2
(45) Date of Patent: Feb. 2, 2021

(54) CLASS-D AMPLIFIER AND SOUND SYSTEM

(71) Applicants: Kabushiki Kaisha Toshiba, Tokyo (JP); Toshiba Electronic Devices & Storage Corporation, Tokyo (JP)

(72) Inventor: Takafumi Kiyono, Ota Gumma (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/562,762

(22) Filed: Sep. 6, 2019

(65) Prior Publication Data

US 2020/0304081 A1 Sep. 24, 2020

(30) Foreign Application Priority Data

Mar. 18, 2019 (JP) .................................. 2019-050348

(51) Int. Cl.
*H03F 3/217* (2006.01)
*H03F 3/185* (2006.01)

(52) U.S. Cl.
CPC ........... *H03F 3/2173* (2013.01); *H03F 3/185* (2013.01); *H03F 2200/03* (2013.01)

(58) Field of Classification Search
CPC ...................................................... H03F 3/217
USPC ........................................ 330/10, 251, 207 A
See application file for complete search history.

(56) References Cited

U.S. PATENT DOCUMENTS

| 6,078,214 A * | 6/2000 | Zhang .................... H03F 3/2171 330/10 |
| 8,013,677 B2 * | 9/2011 | Kaya .................... H03F 3/45475 330/207 A |
| 8,154,358 B2 * | 4/2012 | Beale ........................ H03K 7/08 332/107 |
| 9,077,295 B2 | 7/2015 | Ozaki |
| 10,298,188 B2 | 5/2019 | Kiyono |
| 2006/0044057 A1 * | 3/2006 | Hezar ....................... H03F 3/217 330/10 |

FOREIGN PATENT DOCUMENTS

| JP | 2007-88926 A | 4/2007 |
| JP | 5266830 B2 | 8/2013 |
| JP | 5430025 B2 | 2/2014 |
| JP | 2018-137576 A | 8/2018 |

* cited by examiner

*Primary Examiner* — Henry Choe
(74) *Attorney, Agent, or Firm* — White & Case LLP

(57) ABSTRACT

A class-D amplifier according to an embodiment includes a PWM modulator, a first output transistor group that includes two transistors complementarily operating and includes a first connection point between the two transistors as an output terminal, a second output transistor group that includes two transistors complementarily operating and includes a second connection point between the two output transistors as an output terminal, and a selector configured to selectively provide a PWM pulse signal to one of the first output transistor group and the second output transistor group. A system that includes the second output transistor group, a low-pass filter, and a load connected to the low-pass filter configures a series resonance circuit.

10 Claims, 5 Drawing Sheets

CLASS-D AMPLIFIER AND SOUND SYSTEM

CROSS-REFERENCE TO RELATED APPLICATION

This application is based upon and claims the benefit of priority from the prior Japanese Patent Application No. 2019-50348 filed in Japan on Mar. 18, 2019; the entire contents of which are incorporated herein by reference.

FIELD

Embodiments described herein relate generally to a class-D amplifier and a sound system.

BACKGROUND

A class-D amplifier adopting a PWM modulator is commonly available. In the class-D amplifier, an input signal is subjected to pulse width modulation by being compared with a triangular wave generated by a carrier generator. A PWM pulse generated by the PWM modulator is power-amplified through driving of an output transistor. A switching output of the power-amplified PWM pulse is demodulated with use of a low-pass filter, and a speaker is driven by the demodulated signal. A constant of the low-pass filter is set to an optimum value based on an impedance of the speaker that is a connected load.

In a case where the class-D amplifier is used not as a speaker amplifier to be directly connected to a speaker but as a line amplifier, the constant of the low-pass filter of the class-D amplifier is not optimized because an input impedance of the connected power amplifier is typically lager than the impedance of the speaker.

As a result, frequency characteristics of the class-D amplifier are not flat within a desired frequency band, and a Q-factor near a resonance frequency rises in some cases. If the Q-factor rises, a sound pressure level of the speaker may be varied depending on the frequency, or operation of the class-D amplifier may become unstable.

DETAILED DESCRIPTION

A class-D amplifier according to an embodiment includes a PWM modulator that includes a comparison circuit comparing an input signal and a carrier signal, and is configured to output a PWM pulse signal based on the input signal; a first output transistor group that includes two first output transistors and includes a first connection point between the two first output transistors as a first output terminal, the two first output transistors each including a first on-resistance value and complementarily operating; a second output transistor group that includes two second output transistors and includes a second connection point between the two second output transistors as a second output terminal, the two second output transistors each including a second on-resistance value and complementarily operating; and a selector configured to selectively provide the PWM pulse signal to one of the first output transistor group and the second output transistor group, in which, when the PWM pulse signal is provided to the second output transistor group, a system that includes the second output transistor group, a low-pass filter connected to the second output terminal, and a load connected to the low-pass filter configures a series resonance circuit.

Some embodiments are described below with reference to accompanying drawings.

First Embodiment (Configuration)

Figure 1:
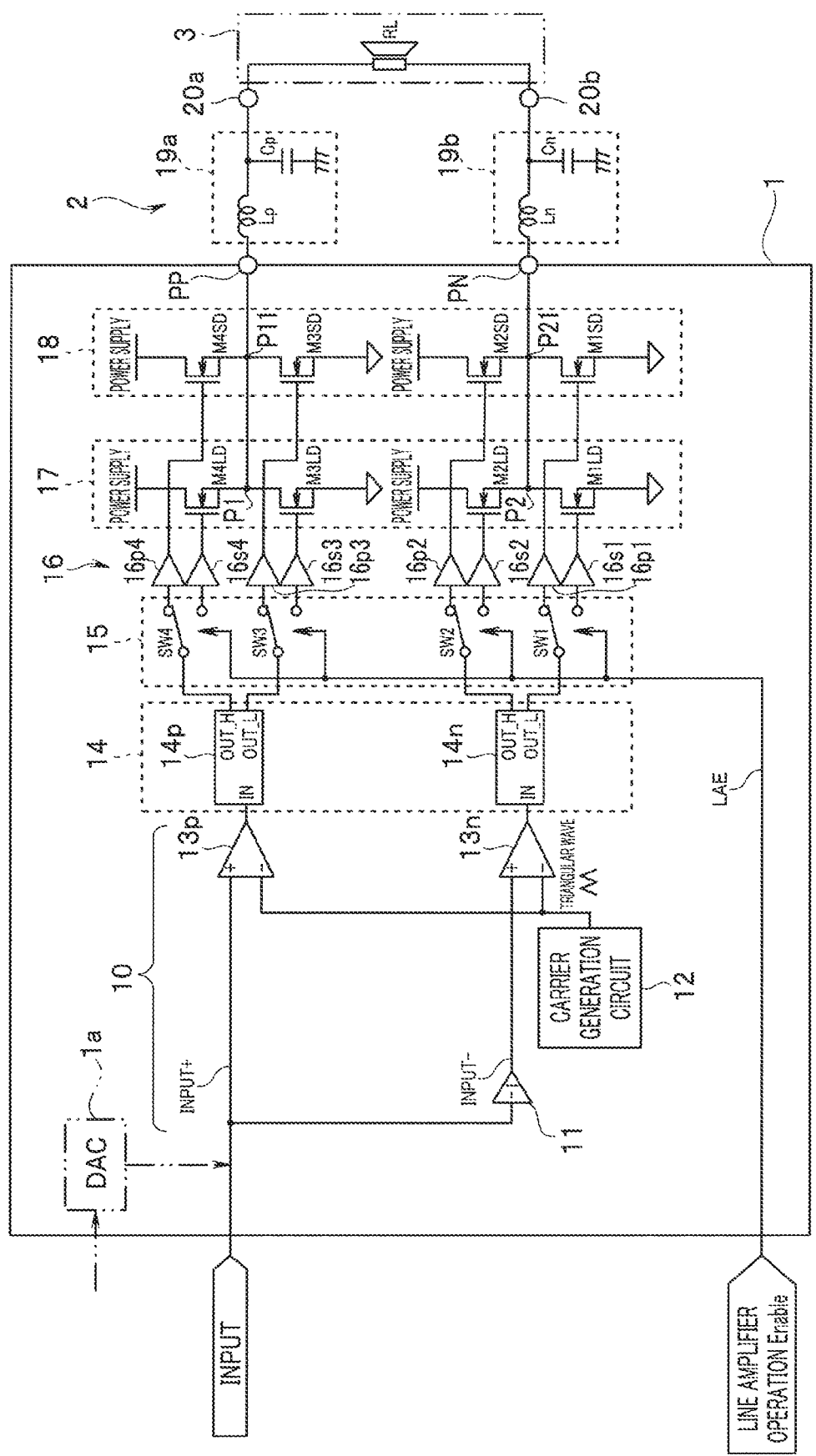
FIG. 1 is a circuit diagram of a class-D amplifier according to a first embodiment.

FIG. 1 is a circuit diagram of a class-D amplifier according to a first embodiment. A class-D amplifier 1 illustrated in FIG. 1 is of a full-bridge type including a PWM modulator. The class-D amplifier 1 can perform speaker amplifier operation and line amplifier operation. The class-D amplifier 1 includes a semiconductor device, namely, a semiconductor chip. An output of the class-D amplifier 1 is demodulated by a demodulation circuit 2 to drive a load 3 such as a speaker. The class-D amplifier 1 and the load 3 configure a sound system. The class-D amplifier 1 includes a PWM modulator 10, a dead time generator 14, a selector 15, a gate driver 16, and output transistor groups 17 and 18.

The PWM modulator 10 includes an inversion circuit 11, a carrier generation circuit 12, and comparison circuits 13$p$ and 13$n$. An input signal (INPUT+) is supplied to the inversion circuit 11 and a non-inversion (positive phase) input terminal of the comparison circuit 13$p$. Further, the input signal is converted into an inverted input signal (INPUT−) by the inversion circuit 11, and the inverted input signal is supplied to a non-inversion (positive phase) input terminal of the comparison circuit 13$n$. The carrier generation circuit 12 generates a triangular wave signal of a predetermined frequency as a carrier signal. The carrier signal is supplied to an inversion (negative phase) input terminal of each of the comparison circuits 13$p$ and 13$n$.

As illustrated by an alternate long and two short dashes line in FIG. 1, a digital-analog converter (hereinafter, referred to as DAC) 1$a$ may be provided in the semiconductor chip configuring the class-D amplifier 1. The input signal (INPUT+) may be obtained by converting a digital signal provided from outside into an analog signal by the DAC 1$a$.

The comparison circuit 13$p$ compares the input signal input to the non-inversion input terminal and the carrier signal input to the inversion input terminal, and outputs a positive-phase PWM pulse signal as a result of the comparison. The comparison circuit 13$n$ compares the inverted input signal input to the non-inversion input terminal and the carrier signal input to the inversion input terminal, and outputs a negative-phase PWM pulse signal as a result of the comparison. The positive-phase PWM pulse signal and the negative-phase PWM pulse signal have a duty ratio corresponding to the input signal.

In other words, the PWM modulator 10 includes the comparison circuits 13$p$ and 13$n$ each comparing the input signal and the carrier signal, and outputs the PWM pulse signals based on the input signal. The positive-phase PWM pulse signal from the comparison circuit 13$p$ and the negative-phase PWM pulse signal from the comparison circuit 13n are each divided into a high side and a low side and power-amplified. The positive-phase PWM pulse signal is supplied to a dead time generation circuit 14p, and the negative-phase PWM pulse signal is supplied to a dead time generation circuit 14n.

The dead time generator 14 includes the dead time generation circuits 14p and 14n. The dead time generation circuits 14p and 14n are provided between the PWM modulator 10 and the selector 15. The dead time generation circuit 14p provides the positive-phase PWM pulse signal with a dead time, and outputs a high-side PWM pulse signal from an OUT_H terminal and outputs a low-side PWM pulse signal from an OUT_L terminal in order to prevent two output transistors on a rear stage from being simultaneously turned on and to prevent a through-current from flowing through the output transistors. Likewise, the dead time generation circuit 14n provides the negative-phase PWM pulse signal with a dead time, and outputs a high-side PWM pulse signal from an OUT_H terminal and outputs a low-side PWM pulse signal from an OUT_L terminal in order to prevent two output transistors on a rear stage from being simultaneously turned on and to prevent a through-current from flowing through the output transistors.

The selector 15 includes four switch circuits SW1 to SW4. The selector 1S switches output destinations of the output signals from the dead time generation circuits 14p and 14n based on a line amplifier operation enable signal LAE as a setting signal. Therefore, the selector 15 includes the four switch circuits SW1 to SW4 to switch the speaker amplifier operation and the line amplifier operation. More specifically, the selector 15 selectively provides the PWM pulse signals to one of the output transistor groups 17 and 18 based on an external signal indicating either the speaker amplifier operation or the line amplifier operation.

The enable signal LAE is provided from the outside of the class-D amplifier 1. For example, high or low of the enable signal LAE is set by an unillustrated setting switch or the like of the class-D amplifier 1.

The gate driver 16 includes eight gate driver circuits 16p1, 16s1, 16p2, 16s2, 16p3, 16s3, 16p4, and 16s4.

The output transistor group 17 is an output device group for the line amplifier operation, and the output transistor group 18 is an output device group for the speaker amplifier operation. The output transistor group 17 includes transistors M1LD, M2LD, M3LD, and M4LD. The output transistor group 18 includes transistors M1SD, M2SD, M3SD, and M4SD. The transistors M1LD and M2LD, the transistors M3LD and M4LD, the transistors M1SD and M2SD, and the transistors M3SD and M4SD are respectively complementarily operated.

Outputs of the gate driver circuits 16p1, 16s1, 16p2, 16s2, 16p3, 16s3, 16p4, and 16s4 are connected to gates of corresponding transistors of the respective output transistor groups 17 and 18. More specifically, the output of the gate driver circuit 16p is connected to a gate of the transistor M1SD, and the output of the gate driver circuit 16s1 is connected to a gate of the transistor M1LD. The output of the gate driver circuit 16p2 is connected to a gate of the transistor M2SD, and the output of the gate driver circuit 16s2 is connected to a gate of the transistor M2LD. The output of the gate driver circuit 16p3 is connected to a gate of the transistor M3SD, and the output of the gate driver circuit 16s3 is connected to a gate of the transistor M3LD. The output of the gate driver circuit 16p4 is connected to a gate of the transistor M4SD, and the output of the gate driver circuit 16s4 is connected to a gate of the transistor M4LD.

When the enable signal LAE is low, the selector 15 switches the respective switch circuits SW1 to SW4 so as to supply the outputs of the dead time generator 14 to the output transistor group 18. In contrast, when the enable signal LAE is high, the selector 15 switches the respective switch circuits SW1 to SW4 so as to supply the outputs of the dead time generator 14 to the output transistor group 17.

In other words, the low-side PWM pulse signal from the dead time generation circuit 14p is supplied to the gate of the transistor M3SD or M3LD through the switch circuit SW3. The low-side PWM pulse signal from the dead time generation circuit 14n is supplied to the gate of the transistor M1SD or M1LD through the switch circuit SW1.

The high-side PWM pulse signal from the dead time generation circuit 14p is supplied to the gate of the transistor M4SD or M4LD through the switch circuit SW4. The high-side PWM pulse signal from the dead time generation circuit 14n is supplied to the gate of the transistor M2SD or M2LD through the switch circuit SW2.

A drain-source path of the transistor M4LD and a drain-source path of the transistor M3LD are connected in series between a power supply and a reference potential point. A drain-source path of the transistor M2LD and a drain-source path of the transistor M1LD are connected in series between the power supply and the reference potential point.

Likewise, a drain-source path of the transistor M4SD and a drain-source path of the transistor M3SD are connected in series between the power supply and the reference potential point. A drain-source path of the transistor M2SD and a drain-source path of the transistor M1SD are connected in series between the power supply and the reference potential point.

A connection point P1 between a source of the transistor M4LD and a drain of the transistor M3LD and a connection point P11 between a source of the transistor M4SD and a drain of the transistor M3SD are connected to an output terminal PP. An amplified positive-phase PWM output signal appears at the connection point P1 and the connection point P11.

A connection point P2 between a source of the transistor M2LD and a drain of the transistor M1LD and a connection point P21 between a source of the transistor M2SD and a drain of the transistor M1SD are connected to an output terminal PN. An amplified negative-phase PWM output signal appears at the connection point P2 and the connection point P21.

A resistance value when each of the transistors in the output transistor groups 17 and 18 is on (hereinafter, also referred to as on-resistance) is described. An on-resistance value of each of the speaker amplifier transistors M1SD, M2SD, M3SD, and M4SD is, for example, hundreds of milliohms. In contrast, an on-resistance value of each of the line amplifier transistors M1LD, M2LD, M3LD, and M4LD is, for example, two ohms, and is larger than the on-resistance value of each of the speaker amplifier transistors.

In this case, a ratio LT of on-resistance of a line amplifier transistor to on-resistance of a speaker amplifier transistor is about 40 times.

Therefore, a gate width GS of the speaker amplifier transistor and a gate width GL of the line amplifier transistor are set to satisfy relationship of the following expression (1), $$GL \leq GS. \tag{1}$$

In other words, on-resistance SR of the speaker amplifier transistor and on-resistance LR of the line amplifier transistor are set to satisfy relationship of the following expression (2), $$SR \leq LR. \tag{2}$$

An impedance of a common speaker viewed from the class-D amplifier 1 is four ohms, six ohms, eight ohms, or the like, and an input impedance of a power amplifier is about 100 ohms to about 10 k ohms. Therefore, the above-described ratio LT (=LR/SR) is required to be within a range of 10 to 1000. If the on-resistance of the line amplifier transistor is made excessively large, various characteristics such as a distortion ratio are adversely affected. Therefore, the above-described ratio LT is preferably within a range of 10 to 100.

More specifically, the on-resistance LR of the line amplifier transistor has a value that allows a system including the transistors as the output devices, low-pass filters 19a and 19b, and the load 3, to be regarded as a series resonance circuit.

In a case of the series resonance circuit, a Q-factor can be expressed by the following equation (3), $$Q = 1/RDS\sqrt{L/C} \tag{3}$$

where RDS is the on-resistance of the output devices, L is an inductance value of the low-pass filters 19a and 19b, and C is a capacitance value of the low-pass filters 19a and 19b.

It is found from the equation (3) that increasing the on-resistance RDS makes it possible to reduce the Q-factor. In a case where the class-D amplifier 1 is operated as a line amplifier, even when load drive capability of the class-D amplifier 1 is lowered, a specification of the connected power amplifier can be satisfied. Accordingly, during the line amplifier operation, setting the on-resistance value RDS of the output devices based on the load impedance makes it possible to configure an optimum system.

A circuit portion from the dead time generation circuits 14p and 14n to the output transistor groups 17 and 18 configures a power amplification unit. A class-D amplification unit is configured of the PWM modulator 10 and the power amplification unit. The connection points P1 and P11 are connected to the positive-phase output terminal PP. The connection points P2 and P21 are connected to the negative-phase output terminal PN. The positive-phase output terminal PP and the negative-phase output terminal PN are output terminals of the class-D amplification unit.

A level of an output signal PWM+ appeared at the positive-phase output terminal PP becomes high in a state where a level of the input signal (INPUT+) is close to a tip of the triangular wave signal, and becomes low in a state where the level of the input signal (INPUT+) is close to center. A level of an output signal PWM− appeared at the negative-phase output terminal PN becomes high in a state where a level of the inverted input signal (INPUT−) is close to a tip of the triangular wave signal, and becomes low in a state where the level of the inverted input signal (INPUT−) is close to center.

The low-pass filters 19a and 19b that configure the demodulation circuit 2 are respectively connected to the positive-phase output terminal PP and the negative-phase output terminal PN. The low-pass filters 19a and 19b are externally mounted on the class-D amplifier 1 that is formed as an IC chip.

The positive-phase output terminal PP is connected to the reference potential point through a coil Lp and a capacitor Cp that configure the low-pass filter 19a. The negative-phase output terminal PN is connected to the reference potential point through a coil Ln and a capacitor Cn that configure the low-pass filter 19b. The low-pass filters 19a and 19b remove a carrier component from the PWM output signals PWM+ and PWM−, and the signal is accordingly restored.

A connection point between the coil Lp and the capacitor Cp is connected to an output terminal 20a, and a connection point between the coil Ln and the capacitor Cn is connected to an output terminal 20b. A speaker or a power amplifier is connected as the load 3 between the output terminals 20a and 20b, based on the intended use of the class-D amplifier 1. FIG. 1 illustrates a case where the load 3 is a speaker.

The respective low-pass filters 19a and 19b are optimized on the assumption that a speaker having a predetermined impedance RL is connected to the class-D amplifier 1. For example, the impedance RL of a standard speaker is four ohms. Respective constants of an inductance of each of the coils Lp and Ln and respective constants of the electrostatic capacitance of each of the capacitors Cp and Cn are set such that frequency characteristics of the class-D amplifier become substantially flat when the speaker having the predetermined impedance RL is connected to the class-D amplifier 1.

In a case where the positive-phase PWM pulse signal has a predetermined level or more, the transistors M4LD and M1LD are turned on, and a current flows from the positive-phase output terminal PP to the negative-phase output terminal PN through the load 3. In a case where the positive-phase PWM pulse signal has a level lower than the predetermined level, the transistors M2LD and M3LD are turned on, and a current flows from the negative-phase output terminal PN to the positive-phase output terminal PP through the load 3. As a result, the speaker outputs the signal based on the PWM output signal PWM+ and the PWM output signal PWM−.

In a case where the class-D amplifier 1 is used as a line amplifier, a power amplifier is connected as the load 3 to the output terminals 20a and 20b. A speaker connected to the power amplifier that is an external amplifier outputs a signal based on the input signal.

(Action)

In the case where the class-D amplifier 1 is used as a speaker amplifier, the enable signal LAE is low. Accordingly, the switch circuit SW4 is switched so as to supply the high-side PWM pulse signal from the dead time generation circuit 14p to the gate driver circuit 16p4, based on the enable signal LAE. The switch circuit SW3 is switched so as to supply the low-side PWM pulse signal from the dead time generation circuit 14p to the gate driver circuit 16p3. Further, the switch circuit SW2 is switched so as to supply the high-side PWM pulse signal from the dead time generation circuit 14n to the gate driver circuit 16p2. The switch circuit SW1 is switched so as to supply the low-side PWM pulse signal from the dead time generation circuit 14n to the gate driver circuit 16p1.

The outputs of the gate driver circuit 16 are supplied to the output transistor group 18. Since the constants of the low-pass filters 19a and 19b are optimized for the case where the speaker having the predetermined impedance such as four ohms is connected to the class-D amplifier 1, the frequency characteristics of the class-D amplifier 1 become substantially flat. In other words, the respective constants of the low-pass filters 19a and 19b are set to the optimum values to cause the frequency characteristics to be substantially flat.

In the case where the class-D amplifier 1 is used as a line amplifier, the enable signal LAE is high. Accordingly, the switch circuit SW4 is switched so as to supply the high-side PWM pulse signal from the dead time generation circuit 14p to the gate driver circuit 16s4, based on the enable signal LAE. The switch circuit SW3 is switched so as to supply the low-side PWM pulse signal from the dead time generation circuit 14p to the gate driver circuit 16s3. Further, the switch circuit SW2 is switched so as to supply the high-side PWM pulse signal from the dead time generation circuit 14n to the gate driver circuit 16s2. The switch circuit SW1 is switched so as to supply the low-side PWM pulse signal from the dead time generation circuit 14n to the gate driver circuit 16s1.

The outputs of the gate driver circuit 16 are supplied to the output transistor group 17. When the on-resistance value of each of the transistors M4LD, M3LD, M2LD, and M1LD is, for example, several ohms, the system including the low-pass filters 19a and 19b and the load 3 is regarded as a series resonance circuit.

In other words, in the case where the class-D amplifier 1 is used as a line amplifier, the system that includes the output transistor group 17, the low-pass filters 19a and 19b, and the load 3 configures the series resonance circuit. The series resonance circuit is formed by making the on-resistance of the output transistor group 17 larger than the on-resistance of the output transistor group 18. The on-resistance of the output transistor group 17 is 10 times to 100 times the on-resistance of the output transistor group 18. Therefore, in the case where a power amplifier is connected to the class-D amplifier 1, the frequency characteristics of the class-D amplifier 1 become substantially flat.

Typically, when a power amplifier is connected to a low-pass filter that has been set to be optimum in a case where the class-D amplifier is operated as a speaker amplifier, the Q-factor near the resonance frequency may rise and operation of the class-D amplifier may become unstable. This is because the on-resistance of each of the transistors as the output devices is set to hundreds of milliohms that is a small value, in order to drive the speaker, and the system including the output devices, the low-pass filter, and the load accordingly configures a parallel resonance circuit. The Q-factor of the parallel resonance circuit is expressed by the following equation (4), $$Q = RL\sqrt{C/L} \qquad (4)$$

where RL is the impedance of the load 3, L is an inductance value of the low-pass filter, and C is a capacitance value of the low-pass filter.

In other words, it is found that when the impedance RL is increased, the Q-factor rises. Therefore, when the power amplifier is connected to the class-D amplifier that has been set for a speaker amplifier, operation of the class-D amplifier may become unstable. Accordingly, using the class-D amplifier in the speaker amplifier operation and the line amplifier operation with use of the same low-pass filter was inadequate.

In contrast, according to the present embodiment, the output transistor group 18 is used in the case where the class-D amplifier 1 is used as a speaker amplifier. When the output transistor group 18 is used, the frequency characteristics of the class-D amplifier 1 become substantially flat because the low-pass filters 19a and 19b are optimized for the impedance of the connected speaker. In addition, in the case where the class-D amplifier 1 is used as a line amplifier, the output transistor group 17 is used. The transistors of the output transistor group 17 each have the on-resistance to allow the system including the load of the connected power amplifier to be regarded as a series resonance circuit. Therefore, the frequency characteristics of the class-D amplifier 1 when the power amplifier is connected also become substantially flat.

Figure 2:
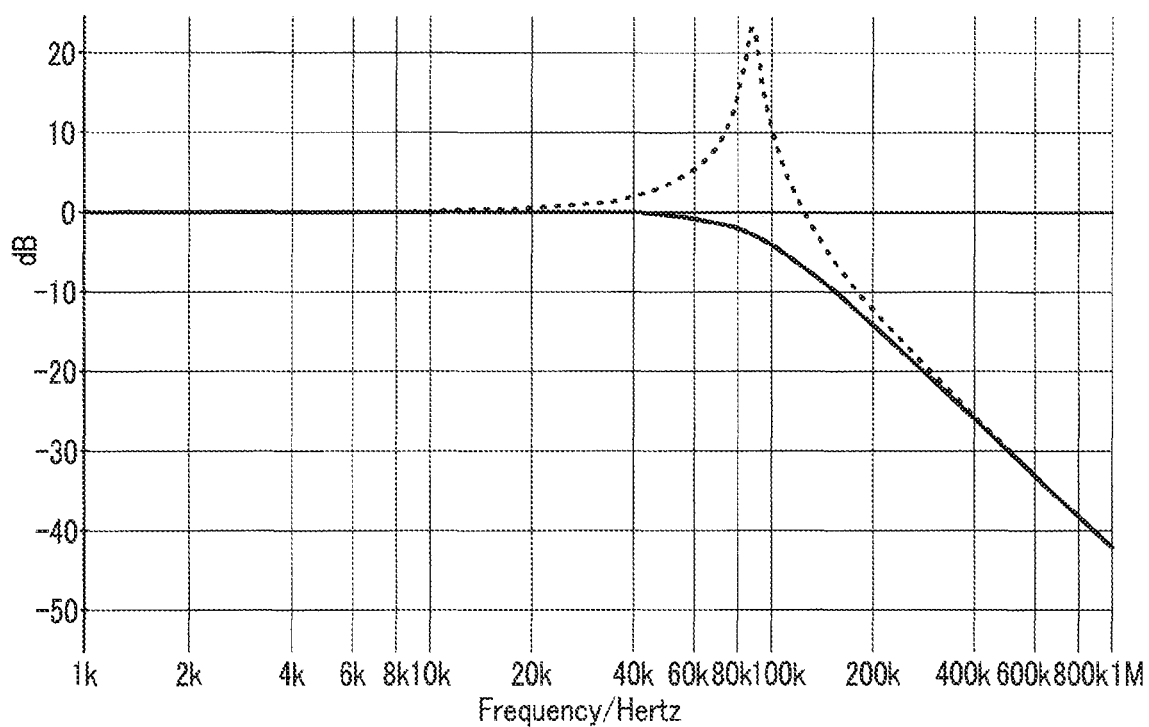
FIG. 2 is a graph illustrating simulation results of frequency characteristics of the class-D amplifier according to the first embodiment.

FIG. 2 is a graph illustrating simulation results of the frequency characteristics of the class-D amplifier 1. A horizontal axis indicates a frequency (Hz), and a vertical axis indicates a gain (dB). A dashed line represents the frequency characteristics of the class-D amplifier 1 when a power amplifier having an impedance of, for example, 600 ohms is connected to the low-pass filter that has been set for the class-D amplifier used as a speaker amplifier. It is illustrated that there are peak characteristics at which the gain is suddenly increased, near the resonance frequency. In contrast, a solid line represents the frequency characteristics of the class-D amplifier 1 when the class-D amplifier 1 according to the present embodiment is used as a line amplifier. The frequency characteristics are substantially flat.

As described above, the present embodiment makes it possible to provide the class-D amplifier and the sound system that each can perform the speaker amplifier operation and the line amplifier operation with use of the same low-pass filter.

Second Embodiment

In the first embodiment, the on-resistance value of each of the line amplifier transistors is made large such that the system including the respective transistors as the output devices, the low-pass filter, and the load can be regarded as the series resonance circuit in the case where the class-D amplifier is used as a line amplifier. In contrast, in a second embodiment, in the case where the class-D amplifier is used as a line amplifier, a resistor is added to the system including the respective line amplifier transistors, the low-pass filter, and the load, to configure the system as the series resonance circuit.

Note that components of the class-D amplifier 1 according to the second embodiment are substantially same as the components of the class-D amplifier 1 according to the first embodiment. Therefore, in the following description of the second embodiment, the same components are denoted by the same reference numerals and the description of such components is omitted, and only a different configuration is described.

(Configuration)

Figure 3:
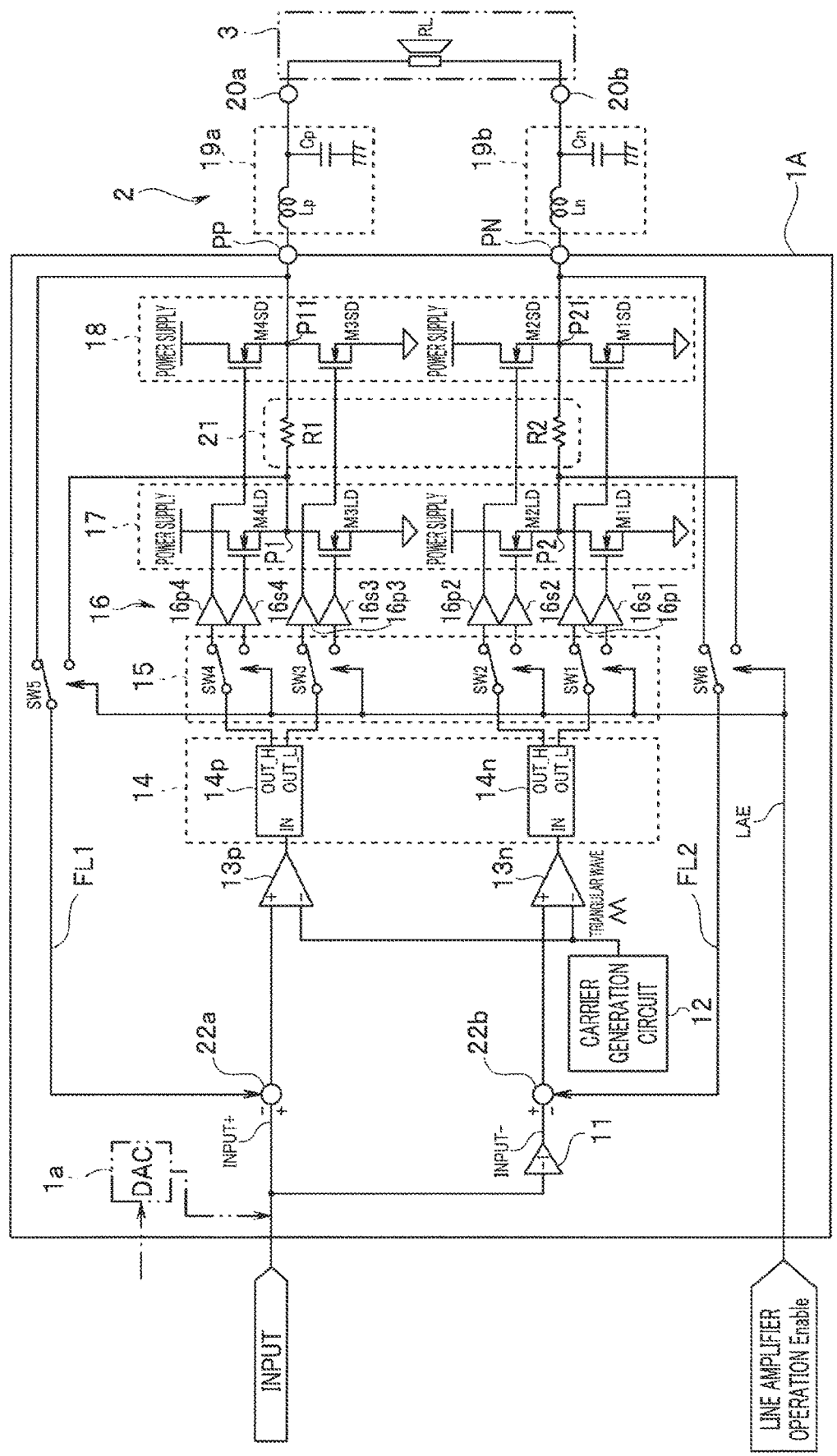
FIG. 3 is a circuit diagram of a class-D amplifier according to a second embodiment.

FIG. 3 is a circuit diagram of a class-D amplifier according to the second embodiment. In FIG. 3, a class-D amplifier 1A includes a circuit that feeds back the PWM output signals. More specifically, the PWM pulse signals can be input to subtractors 22a and 22b respectively through feedback lines FL1 and FL2 as a feedback circuit.

The transistors in the output transistor group 17 are denoted by the same reference numerals as the respective transistors in the output transistor group 17 according to the first embodiment; however, the on-resistance value of each of the transistors is different from the first embodiment. The class-D amplifier 1A includes a resistor group 21 including resistors R1 and R2. More specifically, in the class-D amplifier 1A, the resistor R1 is provided between the connection point P1 and the connection point P11. Likewise, the resistor R2 is provided between the connection point P2 and the connection point P21.

The input signal (INPUT+) and a voltage signal of the positive-phase output terminal PP are input to the subtractor 22a. The subtractor 22a generates a difference signal between the input signal (INPUT+) and the signal of the positive-phase output terminal PP, and outputs the difference signal to the non-inversion input terminal of the comparison circuit 13p.

A switch circuit SW5 is provided in the feedback line FL. The switch circuit SW5 switches the voltage to be supplied to the subtractor 22a, between the voltage of the connection point P1 and the voltage of the connection point P1. Switching of the switch circuit SW5 is performed in response to the enable signal LAE.

Likewise, the inverted input signal (INPUT−) and the voltage signal of the negative-phase output terminal PN are input to the subtractor 22b. The subtractor 22b generates a difference signal between the inverted input signal (INPUT−) and the voltage signal of the negative-phase output terminal PN, and outputs the difference signal to the non-inversion input terminal of the comparison circuit 13n.

A switch circuit SW6 is provided in the feedback line FL2. The switch circuit SW6 switches the voltage to be supplied to the subtractor 22b, between the voltage of the connection point P2 and the voltage of the connection point P21. Switching of the switch circuit SW6 is performed in response to the enable signal LAE.

A value obtained by adding the on-resistance values of the transistors M4LD and M3LD and the resistance value of the resistor R1 is a value that allows the system including the respective transistors, the resistor R1, the low-pass filter 19a, and the load 3, to be regarded as the series resonance circuit. A value obtained by adding the on-resistance values of the transistors M2LD and M1LD and the resistance value of the resistor R2 is a value that allows the system including the respective transistors, the resistor R2, the low-pass filter 19b, and the load 3, to be regarded as the series resonance circuit. The resistance value of the resistor R1 is about 0.5 times to about 5 times the on-resistance value of each of the transistors M4LD and M3LD, and the resistance value of the resistor R2 is about 0.5 times to about 5 times the on-resistance value of each of the transistors M2LD and M1LD.

In other words, the series resonance circuit is formed when the resistor R1 provided between the connection points P1 and P11 and the resistor R2 provided between the connection points P2 and P21 are included in the system including the respective transistors, the low-pass filters 19a and 19b, and the load 3.

This is because, if only the on-resistance value of the output transistor group 17 is increased, a gate area on the semiconductor chip is reduced, which may deteriorate stability of the circuit using the feedback system. Accordingly, the stability of the circuit using the feedback system is secured by the resistance values of the resistors R1 and R2 separately provided without increasing the on-resistance value of the output transistor group 17, unlike the first embodiment. In other words, in the present embodiment, not only the on-resistance value of the output transistor group 17 but also the resistors R1 and R2 separately provided are used in order to secure stability of the feedback system of the class-D amplifier 1A.

(Action)

In a case where the class-D amplifier 1A is used as a speaker amplifier, the enable signal LAE is low. Accordingly, the switch circuit SW5 is switched so as to supply the voltage signal of the connection point P11 to the feedback line FL. The switch circuit SW6 is switched so as to supply the voltage signal of the connection point P21 to the feedback line FL2. The other operation is similar to the operation in the first embodiment. In the present embodiment, since the PWM pulse signals are fed back to the input, the class-D amplifier 1A operates without being influenced by power supply voltage fluctuation or the like.

In a case where the class-D amplifier 1A is used as a line amplifier, the enable signal LAE is high. Accordingly, the switch circuit SW5 is switched so as to supply the voltage signal of the connection point P1 to the feedback line FL1. The switch circuit SW6 is switched so as to supply the voltage signal of the connection point P2 to the feedback line FL2.

The other operation is similar to the operation in the first embodiment. Unlike the first embodiment, the on-resistance value of the output transistor group 17 is not large. When a power amplifier is connected to the class-D amplifier 1A, however, frequency characteristics of the class-D amplifier 1A become substantially flat by the resistors R1 and R2.

As described above, the present embodiment makes it possible to provide the class-D amplifier and the sound system that each can perform the speaker amplifier operation and the line amplifier operation with use of the same low-pass filter.

Figure 4:
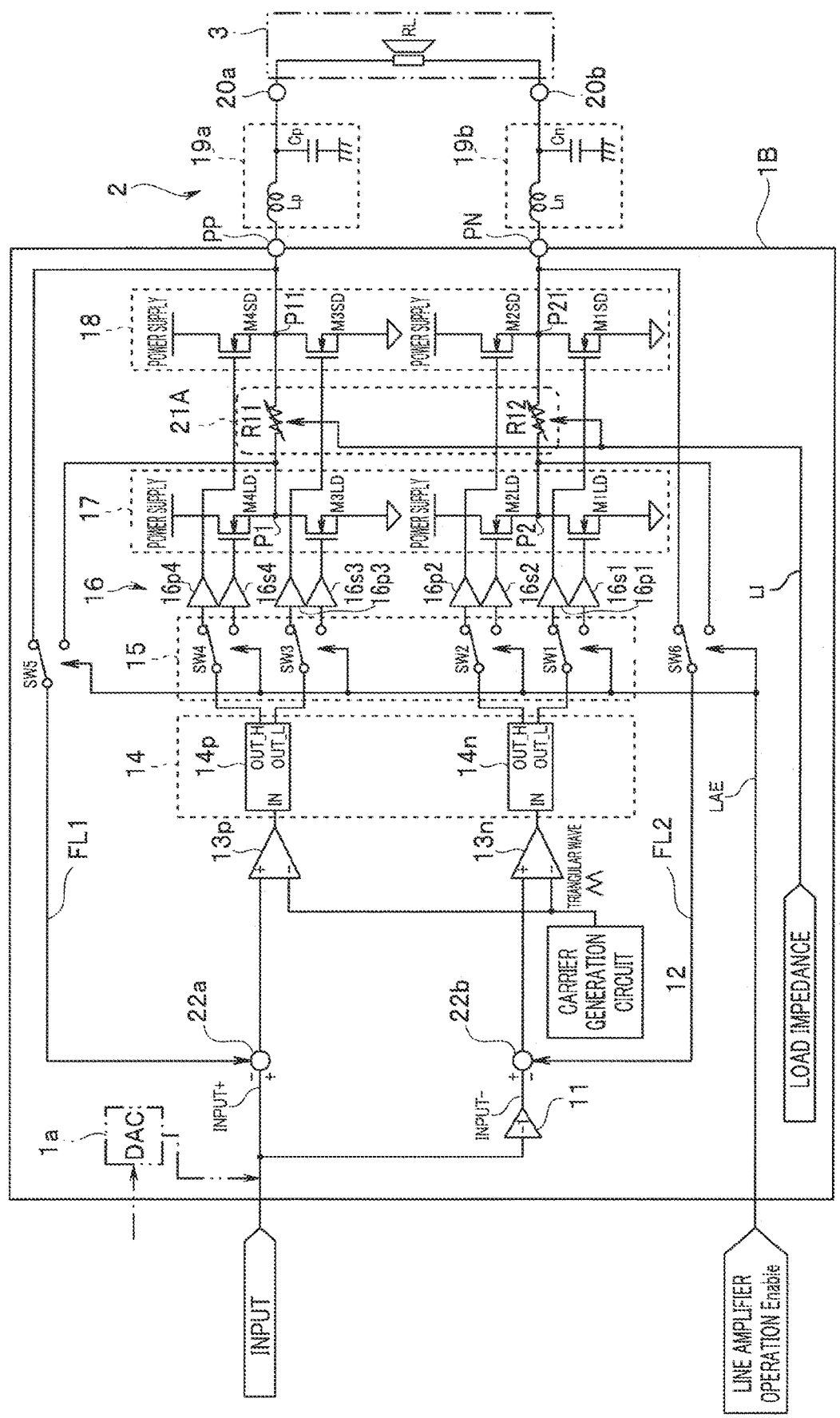
FIG. 4 is a circuit diagram of a class-D amplifier that uses a variable resistor as a resistor, according to the second embodiment.

Each of the above-described resistors R1 and R is a resistor having a fixed resistance value. Alternatively, each of the resistors R1 and R2 may be a variable resistor. FIG. 4 is a circuit diagram of a class-D amplifier 1B that uses variable resistors R11 and R12 in place of the above-described resistors R1 and R2. The class-D amplifier 1B includes a variable resistor group 21A. More specifically, the variable resistor R11 is provided between the connection points P1 and P11, and the variable resistor R12 is provided between the connection points P2 and P21. A resistance value of each of the variable resistors R11 and R12 is set based on a predetermined load signal L1 provided from outside.

In a case where the class-D amplifier 1B includes a self-diagnosis function to detect the impedance of the load 3, the class-D amplifier 1B changes the resistance value of each of the variable resistors R11 and R12 to an appropriate value to form the above-described series resonance circuit, based on the load signal L1 determined based on the detected impedance of the load 3. As a result, frequency characteristics of the class-D amplifier 1B can be made flat based on the impedance of various power amplifiers.

(Modification)

Although the above-described two embodiments relate to the full-bridge class-D amplifiers 1 and 1A, the class-D amplifiers 1 and 1A are applicable to a half-bridge type, namely, a single-ended type. Note that components of the present modification are substantially same as the components of the class-D amplifier 1 according to the first embodiment. Therefore, in the following description of the present modification, the same components are denoted by the same reference numerals and the description of such components is omitted, and only a different configuration is described.

Figure 5:
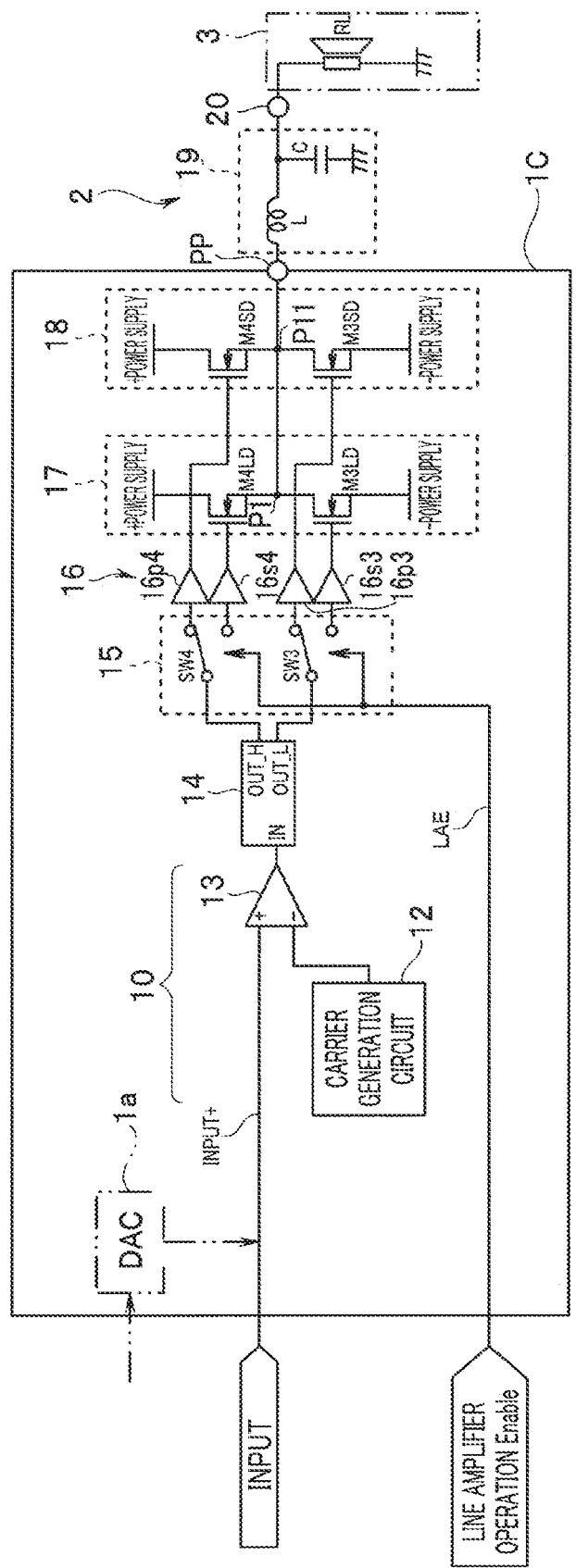
FIG. 5 is a circuit diagram of a class-D amplifier according to a modification.

FIG. 5 is a circuit diagram of a class-D amplifier according to the present modification. A class-D amplifier IC is a half-bridge type of the class-D amplifier 1 illustrated in FIG. 1. The input signal is input to the PWM modulator 10 that includes the carrier generation circuit 12 and a comparison circuit 13. The output of the PWM modulator 10 is supplied to the gate driver 16 through the selector 15 that includes the switch circuits SW3 and SW4. The gate driver 16 includes the gate driver circuits 16s3, 16p3, 16s4, and 16p4. The outputs of the gate driver 16 are supplied to the gates of the respective transistors of the output transistor groups 17 and 18. The connection point P1 between the source of the transistor M4LD and the drain of the transistor M3LD, the connection point P11 between the source of the transistor M4SD and the drain of the transistor M3SD, and the positive-phase output terminal PP are connected to one another.

The drain-source path of the transistor M4LD and the drain-source path of the transistor M3LD are connected in series between a plus power supply and a minus power supply. The drain-source path of the transistor M4SD and the drain-source path of the transistor M3SD are connected in series between the plus power supply and the minus power supply.

The positive-phase output terminal PP is connected to the reference potential point through a coil L and a capacitor C that configure a low-pass filter 19. A connection point between the coil L and the capacitor C is connected to an output terminal 20. A system including the output transistor group 17, the low-pass filter 19, and the load 3 configures a series resonance circuit.

The class-D amplifier IC including such a single-ended circuit can also perform the speaker amplifier operation and the line amplifier operation with use of the same low-pass filter. Although not illustrated here, the class-D amplifiers 1A and 1B according to the second embodiment are also applicable to the half-bridge type, namely, the single-ended type.

As described above, the respective embodiments and the modification described above make it possible to provide the class-D amplifier and the sound system that each can perform the speaker amplifier operation and the line amplifier operation with use of the same low-pass filter.

The operation of the class-D amplifier does not become unstable due to rise of the Q-factor near the resonance frequency. Further, the speaker amplifier and the line amplifier can be configured by the same IC, namely, the same semiconductor chip, and one semiconductor chip can be used for the speaker amplifier and the line amplifier with use of the same low-pass filter. This makes it possible to reduce the number of components.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A class-D amplifier comprising:
    a PWM modulator that includes a comparison circuit comparing an input signal and a carrier signal, and is configured to output a PWM pulse signal based on the input signal;
    a first output transistor group that includes two first output transistors and includes a first connection point between the two first output transistors as a first output terminal, the two first output transistors each including a first on-resistance value and complementarily operating;
    a second output transistor group that includes two second output transistors and includes a second connection point between the two second output transistors as a second output terminal, the two second output transistors each including a second on-resistance value and complementarily operating; and
    a selector configured to selectively provide the PWM pulse signal to one of the first output transistor group and the second output transistor group, wherein
    when the PWM pulse signal is provided to the second output transistor group, a system that includes the second output transistor group, a low-pass filter connected to the second output terminal, and a load connected to the low-pass filter configures a series resonance circuit.

2. The class-D amplifier according to claim 1, wherein the series resonance circuit is formed by making the second on-resistance value larger than the first on-resistance value.

3. The class-D amplifier according to claim 2, wherein the second on-resistance value is 10 times to 100 times the first on-resistance value.

4. The class-D amplifier according to claim 1, further comprising a resistor provided between the first connection point and the second connection point, wherein
    the series resonance circuit is formed by the resistor being included in the system.

5. The class-D amplifier according to claim 4, wherein
    the resistor is a variable resistor, and
    a resistance value of the variable resistor is set based on a predetermined signal.

6. The class-D amplifier according to claim 4, wherein the second on-resistance value is 10 times to 100 times a resistance value of the resistor.

7. The class-D amplifier according to claim 1, wherein the selector selectively provides the PWM pulse signal to one of the first output transistor group and the second output transistor group, based on a signal provided from outside.

8. The class-D amplifier according to claim 1, further comprising a feedback circuit configured to feed back a PWM output signal of the first output terminal to the input signal.

9. The class-D amplifier according to claim 1, further comprising a dead time generation circuit provided between the PWM modulator and the selector.

10. A sound system comprising:
    the class-D amplifier according to claim 1;
    the low-pass filter connected to an output of the class-D amplifier; and
    a load that is either a speaker or an external amplifier, connected to the low-pass filter.

* * * * *